US 6,589,821 B2

(12) United States Patent
Manning (10) Patent No.: US 6,589,821 B2
(45) Date of Patent: *Jul. 8, 2003

(54) METHODS OF FORMING THIN FILM TRANSISTORS

(75) Inventor: Monte Manning, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/996,325

(22) Filed: Dec. 22, 1997

(65) Prior Publication Data

US 2002/0001884 A1 Jan. 3, 2002

Related U.S. Application Data

(63) Continuation of application No. 08/506,084, filed on Jul. 24, 1995, now Pat. No. 5,700,727.

(51) Int. Cl.[7] .............................................. H01L 21/00
(52) U.S. Cl. ....................... 438/149; 438/156; 438/585
(58) Field of Search ................... 438/149, 152, 438/153, 154, 238, 552, FOR 187, FOR 184, FOR 201, 156, 151, 268, 299, 585, 157

(56) References Cited

U.S. PATENT DOCUMENTS

| 4,243,997 A | | 1/1981 | Natori et al. ................ 257/330 |
| 4,467,518 A | * | 8/1984 | Bansal et al. ................ 438/153 |
| 4,845,537 A | | 7/1989 | Nishimura .................. 257/302 |
| 4,864,374 A | | 9/1989 | Banerjee ..................... 257/302 |

(List continued on next page.)

OTHER PUBLICATIONS

J.D. Hayden et al., "A New Toroidal TFT Structure for Future Generation SRAMs," IEEE, 1993, pp. 825–828.
IBM Technical Disclosure Bulletin, "Methods of Forming Small Contact Holes", Jan. 1998, vol. 30, No. 8, pp. 252–253.

Primary Examiner—Michael Trinh
(74) Attorney, Agent, or Firm—Wells St. John P.S.

(57) ABSTRACT

A method of forming a thin film transistor over a substrate is provided whereby at least one of the source region or the drain region is conductively doped while preventing conductivity doping of the channel region without any masking of the channel region occurring by any separate masking layer. A method includes, a) providing a substrate having a node to which electrical connection is to be made; b) providing a first electrically insulative dielectric layer over the substrate; c) providing an electrically conductive gate layer over the first dielectric layer; d) providing a second electrically insulative dielectric layer over the electrically conductive gate layer; e) providing a contact opening through the second dielectric layer, the electrically conductive gate layer and the first dielectric layer; the contact opening defining projecting sidewalls; f) providing a gate dielectric layer within the contact opening laterally inward of the projecting sidewalls; g) providing a layer of semiconductive material over the second dielectric layer and within the contact opening against the gate dielectric layer and in electrical communication with the node; the semiconductive material within the contact opening defining an elongated and outwardly extending channel region the electrical conductance of which can be modulated by means of the adjacent electrically conductive gate and gate dielectric layers; and h) conductively doping the semiconductive material layer lying outwardly of the contact opening to form one of a source region or a drain region of a thin film transistor. Thin film transistor construction are also disclosed.

32 Claims, 6 Drawing Sheets

U.S. PATENT DOCUMENTS

| | | | |
|---|---|---|---|
| 5,001,540 A | 3/1991 | Ishihara | 257/329 |
| 5,156,987 A | 10/1992 | Sandhu | 437/41 TFT |
| 5,208,172 A * | 5/1993 | Fitch et al. | 438/272 |
| 5,214,295 A | 5/1993 | Manning | 437/57 |
| 5,229,310 A | 7/1993 | Sivan | 437/41 TFT |
| 5,270,968 A | 12/1993 | Kim | 437/41 TFT |
| 5,274,259 A | 12/1993 | Grabowski et al. | 257/327 |
| 5,283,455 A | 2/1994 | Inoue | 257/329 |
| 5,334,862 A | 8/1994 | Manning | 437/40 TFT |
| 5,418,393 A | 5/1995 | Hayden | 257/66 |
| 5,432,370 A | 7/1995 | Kitamura et al. | 257/339 |
| 5,444,275 A | 8/1995 | Kugishima et al. | 257/206 |
| 5,463,240 A | 10/1995 | Watanabe | 257/369 |
| 5,508,531 A | 4/1996 | Ha | 257/66 |
| 5,561,308 A | 10/1996 | Kamata et al. | 257/301 |
| 5,612,546 A | 3/1997 | Choi et al. | 257/66 |
| 5,640,034 A | 6/1997 | Malhi | 257/341 |
| 5,700,727 A * | 12/1997 | Manning | 438/156 |
| 5,747,359 A * | 5/1998 | Yuan et al. | 438/593 |
| 5,925,894 A | 7/1999 | Yang | 257/66 |
| 5,930,615 A * | 7/1999 | Manning | 438/232 |
| 6,074,954 A * | 6/2000 | Lill et al. | 438/710 |
| 6,175,134 B1 | 1/2001 | Manning | 257/330 |

\* cited by examiner

METHODS OF FORMING THIN FILM TRANSISTORS

RELATED PATENT DATA

This patent resulted from a continuation application of U.S. patent application Ser. No. 08/506,084, filed Jul. 24, 1995, now U.S. Pat. No. 5,700,727, entitled "Thin Film Transistors and Methods of Forming Thin Film Transistors", naming Monte Manning as inventor, the disclosure of which is incorporated by reference herein.

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates specifically to thin film transistor technology.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. One additional technique finding greater application in achieving reduced transistor size is to form field effect transistors with thin films, which is commonly referred to as "thin film transistor" (TFT) technology. These transistors are formed using thin layers which constitute all or a part of the resultant source and drain regions, as opposed to providing both regions within a bulk semiconductor substrate.

Specifically, typical prior art TFT's are formed from a thin film of semiconductive material (typically polysilicon). A central channel region of the thin film is masked by a separate layer, while opposing adjacent source/drain regions are doped with an appropriate p or n type conductivity enhancing impurity. A gate insulator and gate are provided either above or below the thin film channel region, thus providing a field effect transistor having active and channel regions formed within a thin film as opposed to a bulk substrate.

It would be desirable to improve upon methods of forming thin film transistors and in improving thin film transistor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a thin film transistor over a substrate comprises the following steps:

providing a layer of semiconductive material from which a channel region and at least one of a source region or a drain region of a thin film transistor are to be formed; and conductively doping the at least one of the source region or the drain region of the semiconductive material layer while preventing conductivity doping of the channel region of the semiconductive material layer, such doping being conducted without any masking of the channel region by any separate masking layer.

In accordance with another aspect of the invention, a method of forming a thin film transistor comprises the following steps:

providing a substrate having a node to which electrical connection is to be made;

providing a first electrically insulative dielectric layer over the substrate;

providing an electrically conductive gate layer over the first dielectric layer;

providing a second electrically insulative dielectric layer over the electrically conductive gate layer;

providing a contact opening through the second dielectric layer, the electrically conductive gate layer and the first dielectric layer; the contact opening defining projecting sidewalls;

providing a gate dielectric layer within the contact opening laterally inward of the contact opening sidewalls;

providing a layer of semiconductive material over the second dielectric layer and within the contact opening against the gate dielectric layer and in electrical communication with the node; the semiconductive material within the contact opening defining an elongated and outwardly extending channel region the electrical conductance of which can be modulated by means of the adjacent electrically conductive gate and gate dielectric layers; and conductively doping the semiconductive material layer lying outwardly of the contact opening to form one of a source region or a drain region of a thin film transistor.

In accordance with still another aspect of the invention, a thin film transistor comprises:
   a thin film transistor layer having a source region, a channel region and a drain region; the thin film channel region comprising an annulus; and
   a gate in proximity to the thin film channel annulus, the gate comprising an annulus which surrounds the thin film channel annulus.

These and other aspects of the invention will be more readily appreciated from the following description with proceeds with reference to the accompanying drawings.

Figure 1:
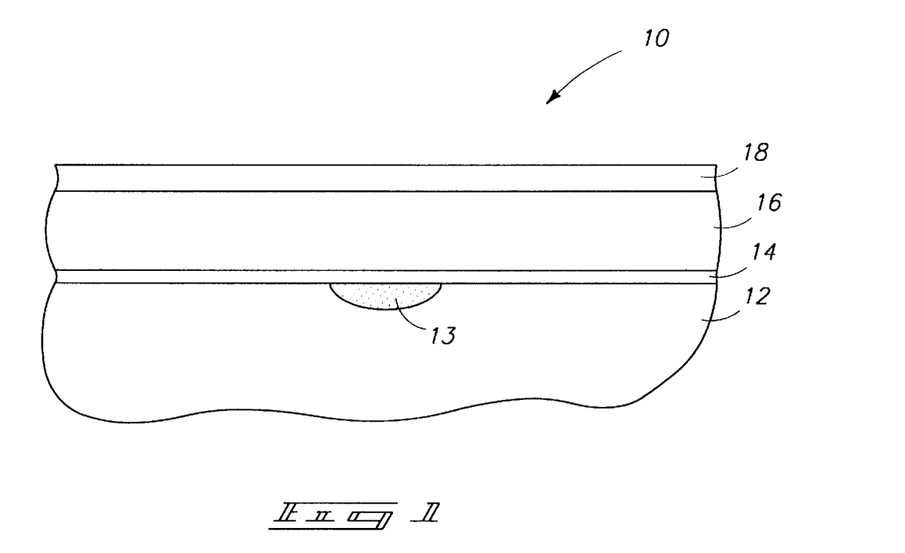
FIG. 1 is a diagrammatic sectional view of a semiconductor wafer fragment at one processing step in accordance with the invention.

Referring to FIG. 1, a semiconductor wafer fragment in process is indicated generally with reference numeral 10. Such comprises a bulk substrate 12 of lightly doped p or n type monocrystalline silicon, having a diffusion region 13 provided therein. A first electrically insulative dielectric layer 14 (typical $SiO_2$) is provided over bulk substrate 12. An example and preferred thickness range for layer 12 is from 50 Angstroms to 2000 Angstroms, with 100 Angstroms being more preferred. An electrically conductive layer 16 is provided over first dielectric layer 14. Layer 16 will ultimately comprise the conductive gate of the thin film transistor, and preferably comprises a heavily doped (greater than $1\times10^{20}$ ion/$cm^3$) layer of polysilicon. An example and preferred thickness range is from 3000 Angstroms to 10,000 Angstroms, with 8000 Angstroms being more preferred. A second electrically insulative dielectric layer 18 is provided over electrically conductive gate layer 16. Such can be considered as a base layer over which a thin film transistor layer will be provided. An example and preferred material is $SiO_2$ deposited to a thickness range of from 300 Angstroms to 3000 Angstroms, with 1000 Angstroms being more preferred.

Figure 2:
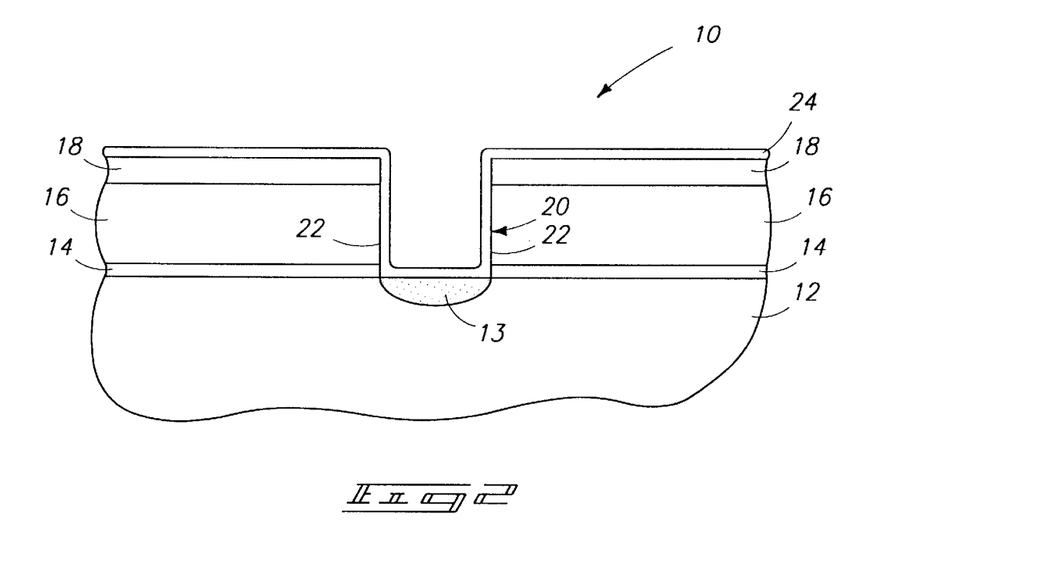
FIG. 2 is a view of the FIG. 1 wafer fragment at a processing step subsequent to that shown by FIG. 1.

Referring to FIG. 2, a contact opening 20 is provided through second dielectric layer 18, electrically conductive gate layer 16, and first dielectric layer 14 to outwardly expose diffusion region 13. Alternately, diffusion region 13 could be provided after forming contact opening 20. One method of doing this is by using ion implantation through contact opening 20, thereby making diffusion regions 13 self-aligned to contact opening 20. Contact opening 20 defines projecting sidewalls 22 which in the preferred embodiment are provided to be substantially perpendicular relative to the expanse of bulk substrate 12. A dielectric layer 24, which will serve as gate dielectric layer, is deposited over second dielectric layer 18 and within contact opening 20 to a thickness which less than completely fills contact opening 20. An example diameter for contact opening 20 is 3500 Angstroms, with an example layer 24 being $SiO_2$ deposited to a thickness of 200 Angstroms in such instance.

Figure 3:
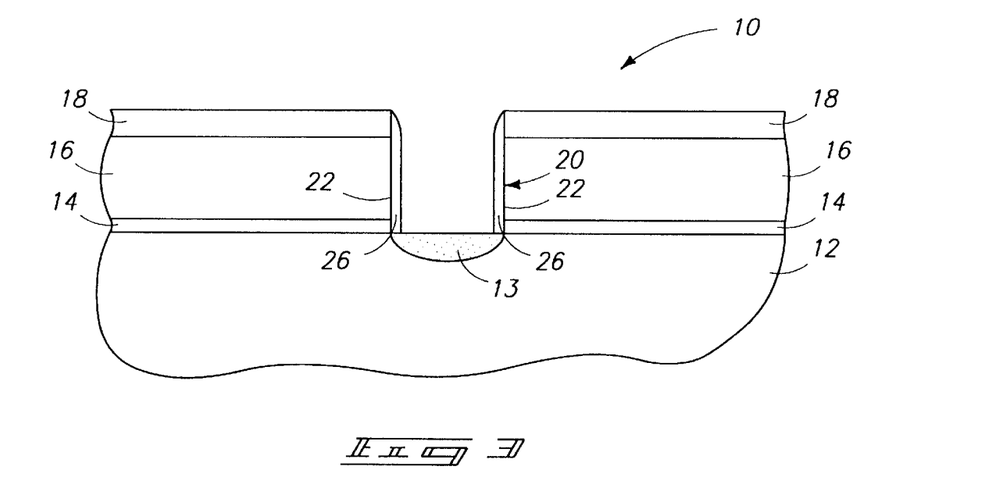
FIG. 3 is a view of the FIG. 1 wafer fragment at a processing step subsequent to that shown by FIG. 2.

Referring to FIG. 3, gate dielectric layer 24 is anisotropically etched to define a resultant gate dielectric layer 26 within contact opening 20 laterally inward of sidewalls 22. When anisotropically etching gate dielectric layer 24, some of second dielectric layer 18 is removed during a desired overetch. If layer 18 is 1000 Angstroms thick and layer 24 is 200 Angstroms thick, a preferred over-etch would be 200 Angstroms, reducing 18 to 800 Angstroms. In the illustrated and preferred embodiment, such gate dielectric layer takes on the shape or appearance of conventional insulative sidewall spacers, and in the depicted embodiment is in the form or shape of a longitudinally elongated annulus. Thus, electrically conductive gate layer 16 also is comprised of an annulus which surrounds contact opening 20.

Figure 4:
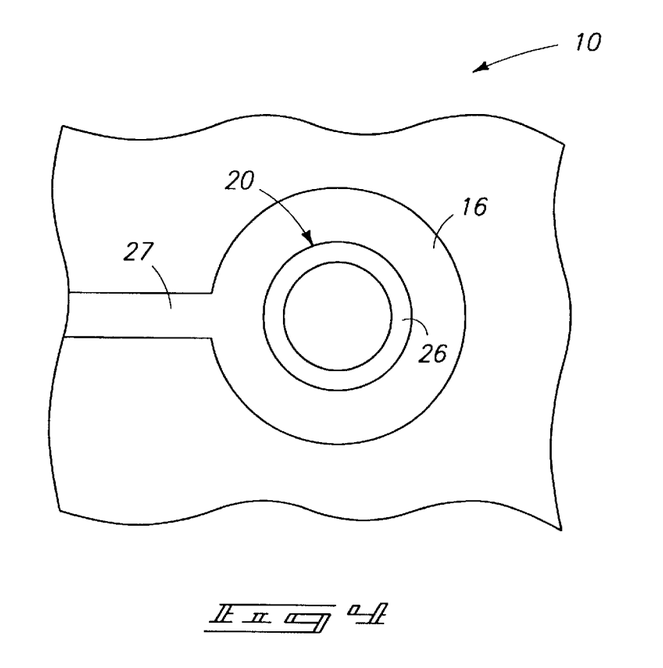
FIG. 4 is one example of a possible top view of FIG. 3.

FIG. 4 illustrates one example of a possible patterned top construction of FIG. 3. Such illustrates gate dielectric annulus 26 encircling within contact opening 20. Electrically conductive gate layer 16 has been patterned to comprise a ring portion and an extension 27. Regardless, the bulk mass of layer 16 constitutes an annulus which encircles contact opening 20. The above described process provides but one example of a manner in which a gate dielectric layer is provided within contact opening 20.

Figure 5:
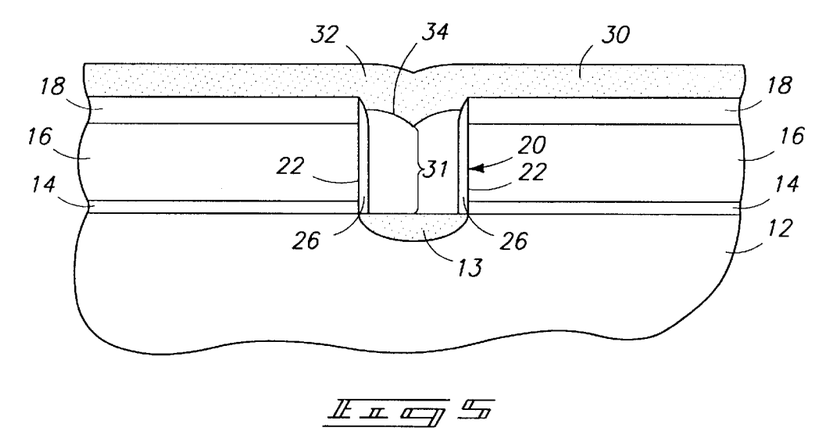
FIG. 5 is a view of the FIG. 1 wafer fragment at a processing step subsequent to that shown by FIG. 3.

Referring to FIG. 5, a layer 30 of semiconductive material is provided over second dielectric layer 18 and within contact opening 20 against gate dielectric layer 26, and in electrical communication with diffusion region 13. In this particular described embodiment, layer 30 is provided to completely fill the remaining open portion of contact opening 20. Semiconductive material layer 30 constitutes a layer from which a channel region and at least one of a source region or a drain region of a thin film transistor are to be formed. The semiconductive material of layer 30 within contact opening 20 defines an elongated and outwardly extending channel region 31 the electrical conductance of which can be modulated by means of the adjacent electrically conductive gate and gate dielectric layers 16 and 26, respectively.

Field effect transistor channel regions typically utilize some minimum conductivity doping, less than the doping concentrations of the source and drain, to provide desired conductance when modulated by the gate. Such can be provided in this example by in situ doping of layer 30 during its deposition. Alternately, an ion implant can be conducted with subsequent processing providing desired diffusion of the dopants.

The semiconductive material layer 30 is then conductively doped such that its portion lying outwardly of contact opening 20 forms one of a source or a drain region 32 of a thin film transistor. The doping results in an interface 34 being created relative to the outermost portions of layer 30 and that portion within channel region 31, such that portion 32 constitutes a highly doped electrically conductive region, while channel region 31 constitutes a semiconductive layer capable of being rendered conductive by applying suitable voltage to gate layer 16. Note that advantageously in accordance with the preferred process, conductive doping of layer 30 is conducted using its thickness, to effectively prevent conductivity doping of channel region 31, with such doping being conducted without other masking of the channel region by any separate masking layer. The effective thickness and doping conditions for the outer portion of layer 30 effectively can be utilized to prevent undesired conductivity enhancing doping of channel region 31.

In the above described embodiment, one of doped regions 32 of layer 30 or diffusion region 13 of bulk substrate 12 constitutes a source region of a thin film transistor, while the other of such constitutes a drain region. Region 31 constitutes a channel region, with gate layer 16 comprising an annulus which encircles thin film channel region 31. Both of channel region 31 and diffusion region 32 are elongated, with diffusion region 32 being oriented substantially perpendicular relative to channel region 31 and also substantially parallel with bulk substrate 14. Elongated channel region 31 and gate dielectric annulus 26 are perpendicularly oriented relative to bulk substrate 14. If region 13 constitutes the drain region, then the thickness of oxide layer 14 defines the gate-drain offset dimension of the thin film transistor. As well known to those of skill in the art, a drain offset is a region used in thin film transistors to reduce off current caused by thermionic field emission in the channel region near the drain. If region 32 is the drain, then the thickness of layer 18 defines the offset dimension. The thickness of gate polysilicon layer 16 defines the channel length of the thin film transistor.

An alternate embodiment is shown and described with reference to FIG. 6. Like numerals from the first described embodiment are utilized where appropriate, with differences being indicated by the suffix "a" or with different numerals. In the depicted embodiment of wafer fragment 10a, semiconductive material 30a is provided to only partially fill the remaining portion of contact opening 20. Such forms an annulus 33 within contact opening 20, with such annulus being utilized to comprise the channel region of the resultant thin film transistor.

Layer 30a can be doped in a single step to form diffusion regions 32a and 35, one of which constitutes a drain region and the other of which constitutes a source region of the resultant thin film transistor. Accordingly, channel annulus 33 is elongated and oriented substantially perpendicularly relative to bulk substrate 12 and diffusion regions 32a and 35. In this described embodiment, gate layer 16 comprises an annulus which surrounds thin film channel annulus 33. Again, the elongated and substantially vertical nature or orientation of channel region 33 prevents conductivity doping from occurring therein when regions 32a and 35 are doped by a highly directional perpendicular ion implantation doping. In this embodiment, diffusion region 13 constitutes a node to which electrical connection of a thin film transistor is to be made, while in the first embodiment example region 13 comprised an inherent part of the thin film transistor. Diffusion region 13 might alternately be provided by out-diffusion of dopant material from region 35 from subsequent heating steps.

Figure 6:
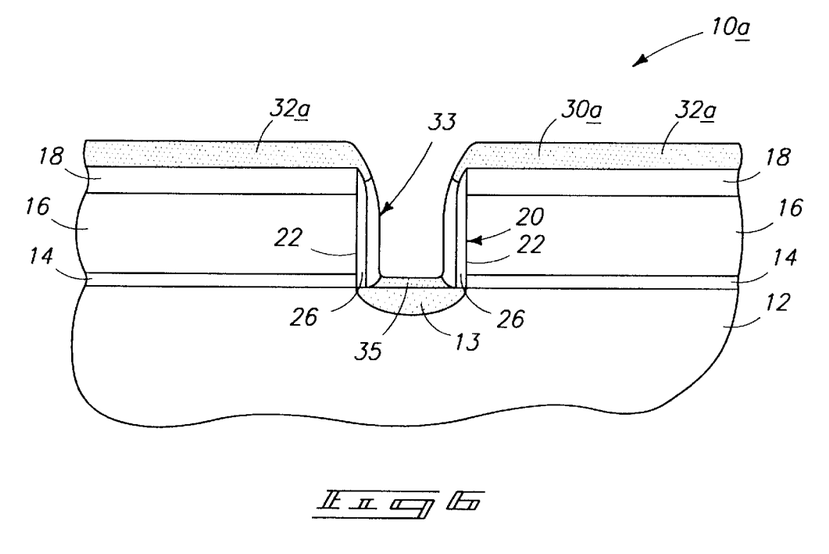
FIG. 6 is a diagrammatic sectional view of an alternate embodiment wafer fragment in accordance with the invention.

Desired minimum doping for the channel region of FIG. 6 can be provided by in situ doping or by ion implanting, such as angled implanting.

Figure 7:
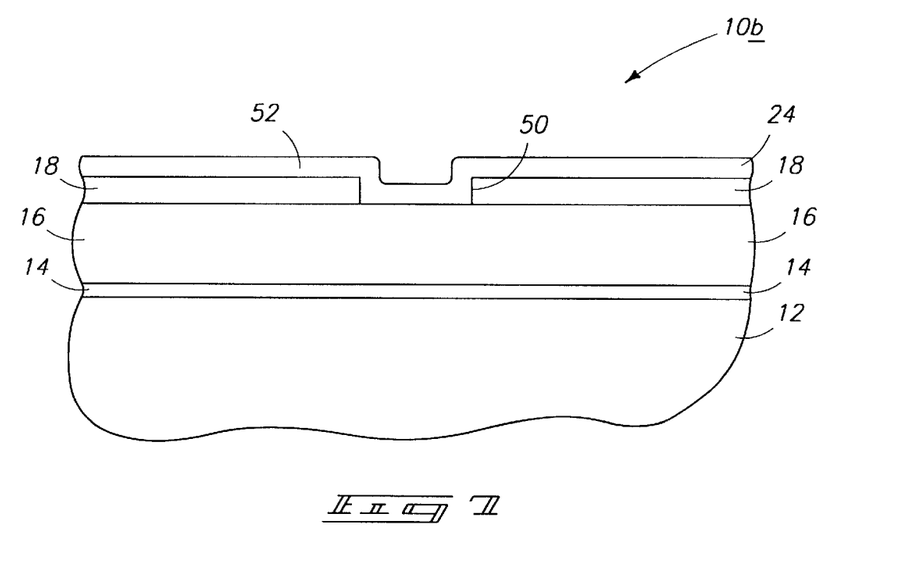
FIG. 7 is a diagrammatic sectional view of yet another alternate embodiment wafer fragment at one processing step in accordance with the invention.

Yet another alternate preferred embodiment is described with reference to FIGS. 7–11. Like numerals from the first described embodiment have been utilized where appropriate, with differences being indicated with the suffix "b" or with different numerals. Referring first to FIG. 7, second electrically insulative dielectric layer 18 is provided with an initial contact opening 50 therethrough to electrically conductive gate layer 16. A preliminary electrically insulative layer 52 is provided over second dielectric layer 18 and to within initial contact opening 50, with such layer less than completely filling contact opening 50.

Figure 8:
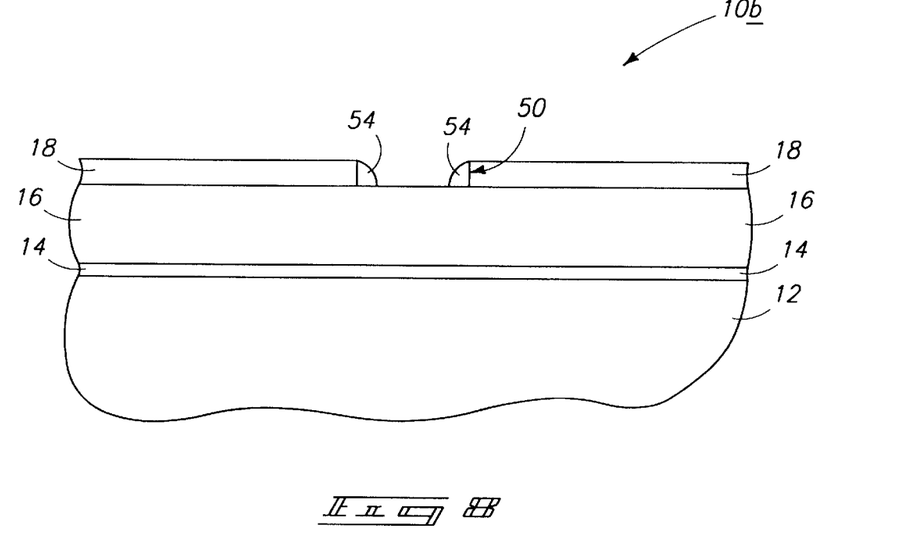
FIG. 8 is a view of the FIG. 7 wafer fragment at a processing step subsequent to that shown by FIG. 7.

Referring to FIG. 8, preliminary electrically insulative layer 52 is anisotropically etched to define an insulative annulus spacer 54 within initial contact opening 50. Such facilitates or enables producing a contact opening inwardly of the spacers which is less than the minimum photolithographic feature size which can be useable to produce the smallest possible initial contact opening 50. For example, where a minimum available photolithographic width for contact opening 50 were 0.32 micron, the resultant width of the opening after spacer etch can be reduced to 0.1 micron. As examples, if layer 18 is 1500 Angstroms thick and opening 50 is 3200 Angstroms in diameter, layer 52 is preferably provided to a thickness of from 500 Angstroms to 1200 Angstroms, with 1000 Angstroms being most preferred. An anisotropic etch of a 1000 Angstrom thick layer 52 will preferably be conducted as an over-etch of 300 Angstroms, leaving layer 18 1200 Angstroms thick.

Figure 9:
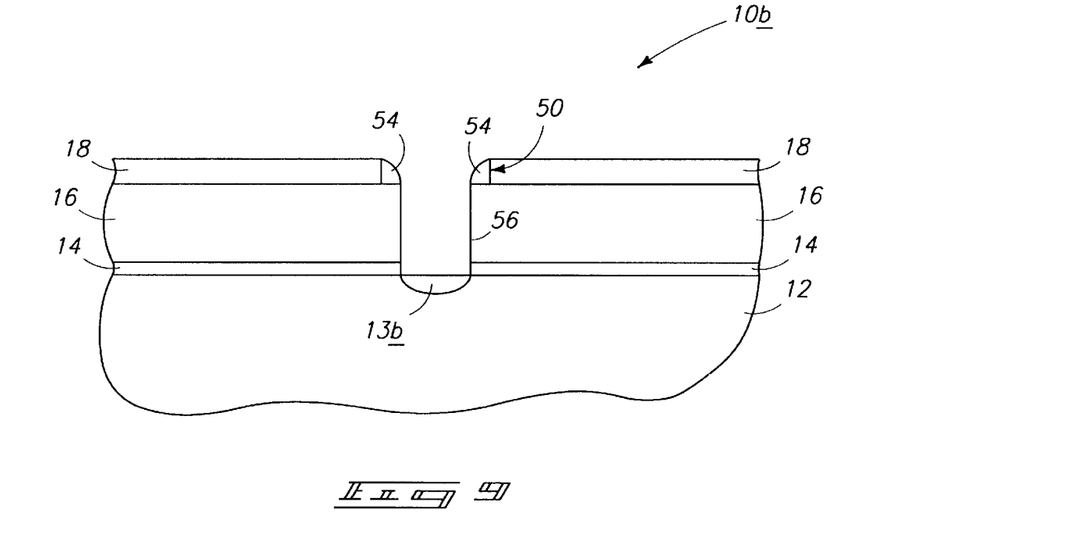
FIG. 9 is a view of the FIG. 7 wafer fragment at a processing step subsequent to that shown by FIG. 8.

Referring to FIG. 9, a secondary contact 56 is etched through electrically conductive gate layer 16 and first dielectric layer 14. During such etching, insulative annulus spacer 54 and second dielectric layer 18 are used as an etching mask. Diffusion regions 13b is provided as shown.

Figure 10:
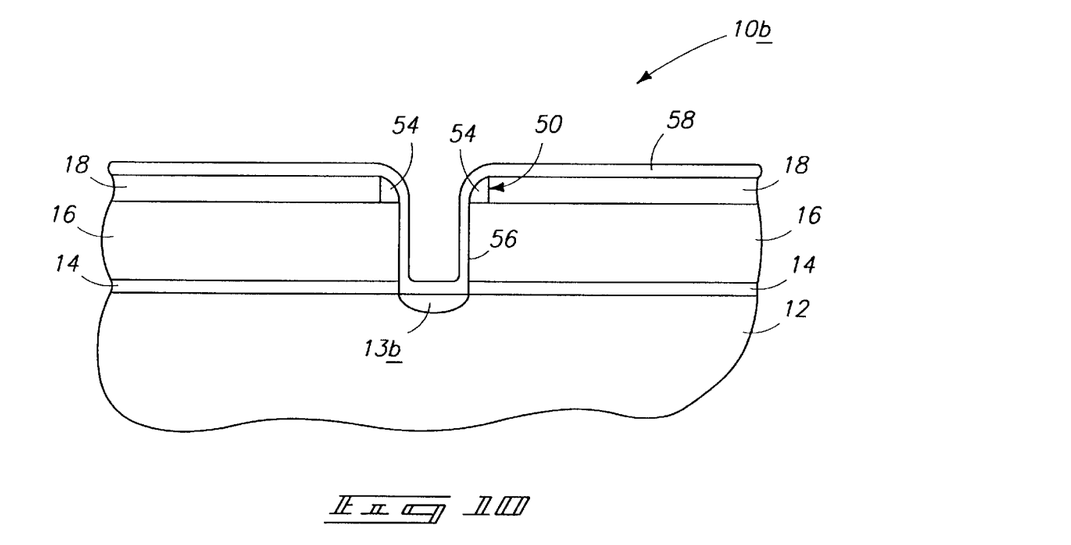
FIG. 10 is a view of the FIG. 7 wafer fragment at a processing step subsequent to that shown by FIG. 9.

Referring to FIG. 10, a secondary electrically insulative layer 58 is provided over second dielectric layer 18 and insulative annulus spacer 54 to within secondary contact opening 56, with such layer being provided to less than completely fill secondary contact opening 56.

Figure 11:
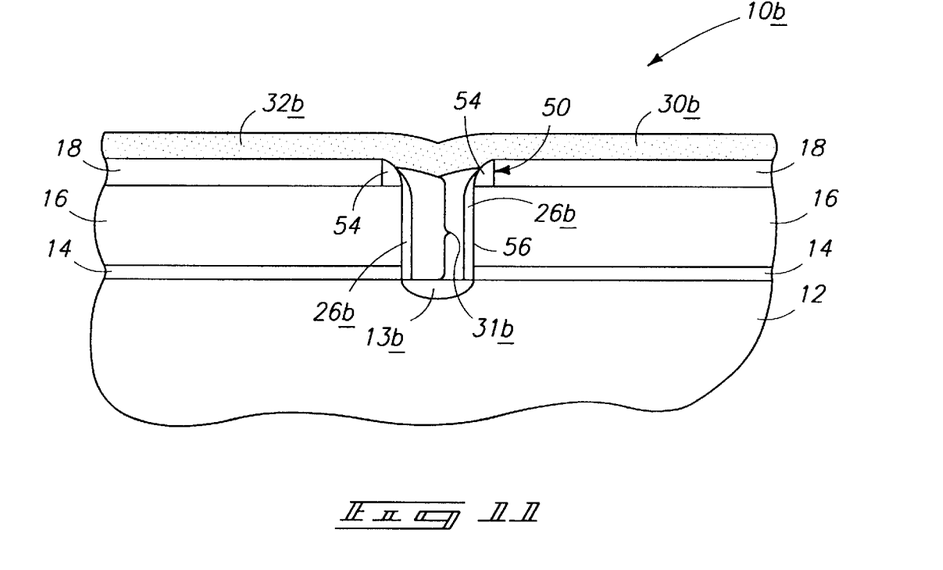
FIG. 11 is a view of the FIG. 7 wafer fragment at a processing step subsequent to that shown by FIG. 10.

Referring to FIG. 11, secondary electrically insulative layer 58 has been anisotropically etched to define a gate dielectric layer annulus 26b within secondary contact opening 56. A subsequent semiconductive layer 30b is provided and doped as shown to provide diffusion region 32b, and to provide channel region 31b. An example thickness for layer 58 is 200 Angstroms. Anisotropic etching of such a layer preferably includes a 200 Angstrom over-etch, resulting in a final preferred thickness of layer 18 of 1000 Angstroms.

The above described embodiments utilizing an annulus gate essentially enables provision of a channel region which is gated about all sides, thus enabling provision of smaller field effect transistors. Such results in a reduced consumption of substrate area, with such example thin film transistors enabling the required area to be that of the contact and the associated anisotropic spacer-like constructions. Conventional horizontal thin film transistors require additional area for the channel, source and drain regions. Such also provides for improved thin film transistor characteristics, due to gating of the channel region on all sides which provides greater controllable on/off currents.

The above described method and embodiment further reduce overall mask count in semiconductor processing. Since in the preferred embodiment the channel region is substantially vertical, masks are not required to protect the desired channel from the thin film transistor source and drain implants. Depending on implementation, the channel region may even be completely sealed from the surface providing even greater protection, thus eliminating at least two masks.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method for forming a thin film transistor comprising:
providing a substrate;
forming a first dielectric layer on the substrate;
forming a conductive layer on the first dielectric layer;
forming a second dielectric layer on the conductive layer;
forming an opening through the first dielectric layer, the conductive layer and second dielectric layer to expose a surface portion of the substrate and sidewall portions of the first dielectric layer, the conductive layer and the second dielectric layer;
forming a conductive node adjacent the opening and the exposed surface portion of the substrate;
depositing a third dielectric layer over the exposed surface portion of the substrate and the sidewall portions of the first dielectric layer, the conductive layer and the second dielectric layer;
depositing a layer of semiconductive material over a portion of the third dielectric layer, the semiconductive material layer filling the opening and extending laterally outward from the opening over the upper surface of the second dielectric layer;
after forming the semiconductive material layer, conductively doping the semiconductive material that is disposed elevationally above the conductive layer, such conductively doped semiconductive material provides one of a source region or a drain region for the thin film transistor, and wherein the conductive layer provides a gate electrode for the thin film transistor, the third dielectric layer laterally adjacent the conductive layer provides a gate dielectric layer, the semiconductive material layer laterally adjacent the gate dielectric layer provides a channel region and the conductive node provides the other of the source or drain region; and wherein a portion of the channel region is formed intermediate an entirety of the sidewall portions of the first dielectric layer.

2. The method of claim 1, wherein forming the opening comprises:

forming a first opening through the second dielectric layer, the first opening having a first dimension defined by exposed sidewalls of the second dielectric layer;

forming an insulative layer over the second dielectric layer and into the first opening, wherein the insulative layer is disposed over the sidewalls: first anisotropically etching the insulative layer to form spacers over the sidewalls, the spacers defining a second opening having a second dimension smaller than the first dimension; and second etching the conductive layer and the first dielectric layer through the second opening, wherein the second etching exposes the surface portion of the substrate.

3. The method of claim 2, wherein the third dielectric layer is deposited over the spacers formed of the insulative layer.

4. The method of claim 1, wherein the forming of the conductive node comprises doping the exposed portion of the substrate through the opening.

5. The method of claim 4, wherein the third dielectric layer is deposited after the doping.

6. The method of claim 1, wherein depositing the third dielectric layer comprises depositing a layer of silicon dioxide having an essentially uniform thickness of approximately 200 Angstroms.

7. The method of claim 1, further comprising, anisotropically etching the deposited third dielectric layer prior to depositing the layer of semiconductive material, the etching comprising removing the third dielectric layer from over the surface portion of the substrate and from over the upper surface of the second dielectric layer, the etching further comprising an over-etching, wherein the over-etching removes a desired amount of the second dielectric layer from the upper surface.

8. The method of claim 7, wherein the desired amount is approximately 200 Angstroms.

9. The method of claim 1, wherein depositing the semiconductive material comprises depositing polysilicon.

10. The method of claim 1, wherein prior to forming the opening through the conductive layer and the first dielectric layer, forming a first opening through the second dielectric layer, the first opening having a dimension defined by spacers over and inwardly disposed from sidewalls of the second dielectric layer; and after forming the opening through the conductive layer and the first dielectric layer, depositing at least some of the third dielectric layer over the spacers.

11. The method of claim 10, wherein depositing the semiconductive material comprises depositing polysilicon.

12. The method of claim 1, wherein the forming of the conductive node comprises forming the conductive node only in the substrate.

13. The method of claim 1, wherein the channel region extends from immediately adjacent the substrate.

14. The method of claim 1, wherein at least a portion of the semiconductor material layer within the opening is substantially undoped.

15. The method of claim 1, wherein the conductively doping comprises substantially preventing dopant from entering the semiconductive material layer within the opening.

16. The method of claim 1, further comprising removing at least portions of the third dielectric layer before the depositing of the layer of the semiconductive material.

17. The method of claim 16, wherein the removing the at least portions of the third dielectric layer comprises etching.

18. A method for forming a thin film transistor comprising:

providing a substrate;

forming a first dielectric layer over the substrate;

forming a gate electrode material layer over the first dielectric layer;

forming a second dielectric layer over the gate electrode material layer;

etching a first opening through the second dielectric layer, the first opening exposing sidewalls of the second dielectric layer;

depositing an insulative layer over the etched second dielectric layer and anisotropically etching the insulative layer to form spacers laterally adjacent the sidewalls;

forming a second opening by etching the first dielectric layer and the gate electrode material layer to expose a surface portion of the substrate and sidewall portions of the first dielectric layer and the gate electrode material layer;

doping the exposed portion of the substrate to form a conductive node;

depositing a third dielectric layer over the conductive node, over the sidewall portions of the first dielectric layer, the gate electrode material layer and the spacers laterally adjacent the second dielectric layer, the third dielectric layer further extending laterally outward from the opening over an upper surface of the second dielectric layer;

anisotropically etching the third dielectric layer, the etching removing essentially all of the third dielectric layer from over the conductive node and from over the upper surface of the second dielectric layer, and leaving some of the third dielectric layer remaining over at least a portion of the spacers;

depositing a layer of semiconductive material, the semiconductive material layer essentially filling the opening and extending laterally outward from the opening over the upper surface of the second dielectric layer;

after forming the semiconductive material layer, conductively doping the semiconductive material disposed elevationally above the gate material layer, the conductively doped portion providing one of a source region or a drain region for the thin film transistor, wherein the gate material layer provides a gate electrode for the thin film transistor, a portion of the third dielectric layer adjacent the gate material layer provides a gate dielectric layer for the thin film transistor, a portion of the semiconductive material layer adjacent the gate dielectric layer provides a channel region for the thin film transistor and the conductive node provides the other of the source or drain region for the thin film transistor; and wherein the channel region extends from immediately adjacent the substrate.

19. The method of claim 18, wherein the third dielectric material comprises silicon dioxide.

20. The method of claim 18, wherein the semiconductive material comprises polysilicon.

21. The method of claim 18, wherein the forming of the conductive node comprises forming the conductive node only in the substrate.

22. The method of claim 18, wherein a portion of the channel region is formed intermediate an entirety of the sidewall portions of the first dielectric layer.

23. The method of claim 18, wherein at least a portion of the semiconductor material layer within the opening is substantially undoped.

24. The method of claim 18, wherein the conductively doping comprises substantially preventing dopant from entering the semiconductive material layer within the opening.

25. The method of claim 18, wherein the forming the opening comprises forming the second opening through the first opening and exposing the substrate.

26. A method for forming a thin film transistor comprising:

providing a substrate;

forming a first dielectric layer over the substrate;

forming a conductive layer over the first dielectric layer;

forming a second dielectric layer over the conductive layer;

forming an opening through the first dielectric layer, the conductive layer and second dielectric layer to expose a surface portion of the substrate and sidewall portions of the first dielectric layer, the conductive layer and the second dielectric layer;

depositing a third dielectric layer over the exposed surface portion of the substrate and the sidewall portions of the first dielectric layer, the conductive layer and the second dielectric layer, and over an upper surface of the second dielectric layer;

anisotropically etching the deposited third dielectric layer, the etching comprising removing the third dielectric layer from over the surface portion of the substrate and for over the upper surface of the second dielectric layer, the etching further comprising an over-etching, wherein the over-etching removes a desired amount of the second dielectric material from the upper surface;

doping the surface portion of the substrate to form a conductive node;

after the doping, the depositing a layer of semiconductive material over the third dielectric layer, the semiconductive material layer filling the opening and extending laterally outward from the opening over the upper surface of the second dielectric layer;

after forming the semiconductive material layer, conductively doping the semiconductive material that is disposed elevationally above the conductive layer, such conductively doped semiconductive material provides one of a source region or a drain region for the thin film transistor, and wherein the conductive layer provides a gate electrode for the thin film transistor, the third dielectric layer laterally adjacent the conductive layer provides a gate dielectric layer, the semiconductive material layer laterally adjacent the gate dielectric layer provides a channel region and the conductive node provides the other of the source or drain region; and wherein the channel region extends from immediately adjacent the substrate.

27. The method of claim 26, wherein the desired amount is approximately 200 Angstroms.

28. The method of claim 26, wherein the forming of the conductive node comprises forming the conductive node only in the substrate.

29. The method of claim 26, wherein a portion of the channel region is formed intermediate an entirety of the sidewall portions of the first dielectric layer.

30. The method of claim 26, wherein at least a portion of the semiconductor material layer within the opening is substantially undoped.

31. The method of claim 26, wherein the conductively doping comprises substantially preventing dopant from entering the semiconductive material layer within the opening.

32. A method for forming a thin film transistor comprising:

providing a substrate;

forming a first dielectric layer on the substrate;

forming a conductive layer on the first dielectric layer;

forming a second dielectric layer on the conductive layer;

forming an opening through the first dielectric layer, the conductive layer and second dielectric layer to expose a surface portion of the substrate and sidewall portions of the first dielectric layer, the conductive layer and the second dielectric layer;

forming a conductive node adjacent the opening and the exposed surface portion of the substrate;

depositing a third dielectric layer over the exposed surface portion of the substrate and the sidewall portions of the first dielectric layer, the conductive layer and the second dielectric layer;

depositing a layer of semiconductive material over a portion of the third dielectric layer, the semiconductive material layer filling the opening and extending laterally outward from the opening over the upper surface of the second dielectric layer;

after forming the semiconductive material layer, conductively doping the semiconductive material that is disposed elevationally above the conductive layer, such conductively doped semiconductive material provides one of a source region or a drain region for the thin film transistor, and wherein the conductive layer provides a gate electrode for the thin film transistor, the third dielectric layer laterally adjacent the conductive layer provides a gate dielectric layer, the semiconductive material layer laterally adjacent the gate dielectric layer provides a channel region and the conductive node provides the other of the source or drain region; and wherein the channel region extends from immediately adjacent the substrate.

* * * * *

UNITED STATES PATENT AND TRADEMARK OFFICE
CERTIFICATE OF CORRECTION

PATENT NO. : 6,589,821 B2  Page 1 of 1
DATED : July 8, 2003
INVENTOR(S) : Monte Manning It is certified that error appears in the above-identified patent and that said Letters Patent is hereby corrected as shown below:

Title page,
Item [56], References Cited, U.S. PATENT DOCUMENTS, insert the following references:
-- 5,397,731   03/1995   Takemura...................437/67
   5,599,724   02/1997   Yoshida......................437/67
   5,994,735   11/1999   Maeda et al..................257/329 --
Item [57], ABSTRACT,
Line 28, replace "transistor. Thin film transistor construction are also" with -- transistor. Thin film transistor constructions are also --

Column 9,
Lines 20-21, replace "wherein the forming the opening comprises forming the" with
-- wherein the forming the second opening comprises forming the --
Line 44, replace "for over the upper surface of the second dielectric layer," with
-- from over the upper surface of the second dielectric layer, --
Line 51, replace "after the doping, the depositing a layer of semiconductive" with
-- after the doping, depositing a layer of semiconductive --

Signed and Sealed this

Fourteenth Day of October, 2003

JAMES E. ROGAN
*Director of the United States Patent and Trademark Office*